United States Patent [19]
Gilbert

[11] Patent Number: 6,104,244
[45] Date of Patent: Aug. 15, 2000

[54] AMPLIFIER HAVING A RAIL-TO-RAIL OUTPUT STAGE

[75] Inventor: Barrie Gilbert, Portland, Oreg.

[73] Assignee: Analog Devices, Inc., Norwood, Mass.

[21] Appl. No.: 09/146,052

[22] Filed: Sep. 2, 1998

[51] Int. Cl.[7] .................................................... H03F 3/26
[52] U.S. Cl. ......................................... 330/267; 330/292
[58] Field of Search .................................. 330/255, 263, 330/267, 268, 292

[56] References Cited

U.S. PATENT DOCUMENTS

| | | |
|---|---|---|
| 5,412,344 | 5/1995 | Franck ................................. 330/292 X |
| 5,869,989 | 2/1999 | Furuya et al. ....................... 330/268 X |

OTHER PUBLICATIONS

Gray, Paul R. and Meyer, Robert G.; *Analysis and Design of Analog Integrated Circuits*; Berkely, CA; (1993) pp. 378–403.

Gilbert, Barrie; *Translinear Circuits: An Historical Overview*; Boston, MA; 1996; pp. 95–118.

Solomon, James; The Monolithic Op Amp: A Tutorial Study; *IEEE Journal of Solid–State Circuits*, vol. SC–9, (1974) pp. 314–332.

Gilbert, Barrie; A New Wide–Band Amplifier Technique; *IEEE Journal of Solid–State Circuits*, vol. SC–9, No. 4 (1968) pp. 353–365.

*Primary Examiner*—Steven J. Mottola

*Attorney, Agent, or Firm*—Marger Johnson & McCollom, P.C.

[57] ABSTRACT

A rail-to-rail output circuit synthesizes a constant product output characteristic by replicating the current through a pull-up transistor and utilizing a translinear loop to drive a complementary pull-down transistor responsive to the replicated current. A smaller replication transistor shares a common $V_{BE}$ with the pull-up transistor so as to generate a scaled replication current that is proportional to the current through the pull-up transistor. The replication transistor is coupled to the base of the pull-down transistor through a bias circuit that forms a fast translinear loop with the pull-down transistor. An emitter follower transistor sevoes the loop so that the product of the currents through the pull-up and pull-down transistors is proportional to the square of a bias current. To reduce the turn-off time of the pull-down transistor, a second replication transistor is be connected with its base-emitter junction sharing the $V_{BE}$ of the pull-up transistor and its collector coupled to the base of the pull-down transistor through a current mirror, thereby providing a deliberate path for discharging current from the base of the pull-down transistor as it turns off. A current limit circuit provides smooth and accurate current limiting by generating sense currents that replicate the currents through the pull-up and pull-down transistors, summing the sense currents with accurate reference currents, and diverting the bias current to the translinear loop or the tail current to a transconductance input stage responsive to the difference between the sense currents and the reference currents.

28 Claims, 5 Drawing Sheets

AMPLIFIER HAVING A RAIL-TO-RAIL OUTPUT STAGE

BACKGROUND OF THE INVENTION

1. Field of the Invention

This invention relates generally to output stages for bipolar monolithic integrated circuits, and more particularly, to rail-to-rail output stages that have constant product output characteristics.

2. Description of the Related Art

A typical class AB output stage for a conventional operational amplifier implemented with bipolar junction transistors (BJTs) is shown generally at 10 in FIG. 1. Output current is provided by transistors Q101 and Q102 which are connected "emitter-to-emitter". Transistor Q101 sources current $I_P$, and transistor Q102 sinks current $I_N$ to provide an output current $I_L$ having symmetric drive characteristics. Diodes D101 and D102 form a translinear loop with Q101 and Q102 to create a small quiescent current through Q101 and Q102, thereby reducing crossover distortion that occurs when the output current swings through zero. Diodes D101 and D102, which are typically fabricated from diode-connected transistors in a monolithic implementation, are biased by the bias current $I_Q$ generated by transistor Q103.

The translinear loop formed by D101, D102, Q101 and Q102 imparts a constant product characteristic to the output stage. This loop can be analyzed using the translinear principle which provides that in a closed loop containing an even number of ideal junctions, arranged so that there are an equal number of clockwise-facing and counter-clockwise-facing polarities, with no further voltage generators inside this loop, the product of the current densities in the clockwise direction is equal to the product of the current densities in the counter-clockwise direction.

The emitter areas of Q101 and Q102 are each Me where "e" is a unit emitter area. Thus, the current density in the base-emitter junction of Q101 is $I_P/Me$, and the current density in the base-emitter junction of Q102 is $I_N/Me$. The emitter areas of the transistors forming D101 and D102 are unit areas "e". Therefore, the current densities in the base-emitter junctions of D101 and D102 are each $I_Q/e$. Applying the translinear principle to these current densities results in the following equation:

$$I_N/Me \cdot I_P/Me = I_Q/e \cdot I_Q/e \qquad (\text{Eq. 1})$$

Rearranging terms provides the following result:

$$I_N I_P = M^2 I_Q^2 \qquad (\text{Eq. 2})$$

Thus, the product of $I_P$ and $I_N$ is equal to a scaling factor times the bias current squared.

A disadvantage of the circuit of FIG. 1 is that the voltage at the emitter of transistor Q101 must remain at least a diode voltage drop ("$V_{BE}$") plus a saturation voltage $V_{CE}$ for the current source transistor Q103 below the positive power supply rail VP, and the emitter of transistor Q102 must remain at least a $V_{BE}$ plus a saturation voltage $V_{CE}$ for the current source transistor Q104 above the negative power supply rail VN or else the transistors will turn off. Thus, the maximum voltage swing available at the output terminal VOUT is at least 2×(0.8+0.2) or 2.0 volts less than the total available power supply voltage (VP minus VN). In low power supply voltage circuits that operate with power supplies of 2.7 volts or less, this only allows an output voltage swing of less than 1 volt.

To improve the swing range of the output stage, amplifiers have been made having the output transistors connected "collector-to-collector" as shown in FIG. 2. This greatly improves the theoretical output swing because the collectors of output transistors $Q_P$ and $Q_N$ can operate to within about 0.2 volts of the positive and negative power supply rails $V_P$ and $V_N$, respectively. Thus, the circuit of FIG. 2 is often referred to as a "rail-to-rail" output stage. However, the output transistors are more difficult to drive because the collector-to-collector connection of $Q_P$ and $Q_N$ prevents the use of the simple two diode biasing scheme used in the circuit of FIG. 1.

Circuit that utilize the general topology shown in FIG. 2 can generally be classified into two groups: (1) circuits that use a current mirror approach to driving $Q_P$ and $Q_N$; and (2) circuits that use some type of constant-product control (between the positive and negative portions of the output stage). Although circuits that provide accurate drive under ideal conditions have been devised, they are generally complicated which causes them to perform poorly under many of the different practical conditions that are demanded of operational amplifiers, particularly large-signal transient conditions.

SUMMARY OF THE INVENTION

Therefore, it is an object of the present invention to provide an improved method and apparatus for accurately driving a rail-to-rail output stage.

Another object of the present invention is to simplify the design of a rail-to-rail output stage.

To accomplish these and other objects, a rail-to-rail output circuit constructed in accordance with the present invention synthesizes a constant product output characteristic by replicating the current through a pull-up transistor and utilizing a translinear loop to drive a complementary pull-down transistor responsive to the replicated current.

The pull-up transistor is driven by a current mode signal from a gm stage through a driver transistor. A smaller transistor of like polarity shares a common $V_{BE}$ with the pull-up transistor so as to generate a scaled current proportional to the current through the pull-up transistor. The smaller transistor is coupled to the base of the pull-down transistor through a first diode-connected transistor. A bias transistor couples a bias current from a bias current source to a negative power supply through a second diode connected transistor. The first and second diode connected transistors, the bias transistor, and the pull-down transistor form a fast translinear loop in which the junction of the first diode connected transistor and the base-emitter junction of the pull-down transistor are oriented in a first direction around the translinear loop, and the junction of the second diode connected transistor and the base-emitter junction of the pull-down transistor are oriented in a second direction around the translinear loop.

The loop is servoed by an emitter follower transistor which maintains the bias current through the bias transistor so that the product of the currents through the pull-up and pull-down transistors is proportional to the square of the bias current.

In one embodiment, a resistor connected across the base-emitter junction of the pull-down transistor biases the emitter follower transistor and provides a path for discharging current from the base of the pull-down transistor as it turns off.

To reduce the turn-off time of the pull-down transistor, a second replication transistor can be connected with its base-emitter junction sharing the of the pull-up transistor and its collector coupled to the base of the pull-down transistor through a current mirror, thereby providing a deliberate path for discharging current from the base of the pull-down transistor as it turns off.

A compensation capacitor, which is connected from the output terminal to the input of the cascade transistor ensures stable operation at all frequencies.

An optional current limit circuit provides smooth and accurate current limiting through by generating a sense current that replicates the current through the pull-down transistor, summing the sense current with an accurate reference current, and diverting the bias current responsive to the difference between the sense current and the reference current.

To limit the current through the pull-up transistor, the current limit circuit generates a sense current that replicates the current through the pull-down transistor, sums the sense current with an accurate reference current, and diverts the tail current through a transconductance input stage responsive to the difference between the sense current and the reference current.

To limit the power dissipated in the output circuit to a constant value, a an optional constant power circuit controls the bias current, and thus the product of the currents through the pull-up and pull-down transistors, responsive to the power supply voltage.

One aspect of the present invention is a rail-to-rail output circuit comprising: a first transistor having a first terminal coupled to a first power supply rail, and a second terminal coupled to an output terminal to provide a first current thereto; a second transistor having a first terminal coupled to a second power supply rail, and a second terminal coupled to the output terminal for providing a second current thereto; a third transistor coupled to the first transistor to replicate the first current, thereby generating a third current; and a bias circuit coupled to the third transistor to receive the third current and coupled to the second transistor to form a translinear loop with the second transistor. The bias circuit further includes a transistor coupled to the translinear loop to servo the loop.

Another aspect of the present invention is a method for driving a rail-to-rail output circuit including a first transistor having a first terminal coupled to a first power supply rail, and a second terminal coupled to an output terminal to provide a first current thereto, and a second transistor having a first terminal coupled to a second power supply rail, and a second terminal coupled to the output terminal for providing a second current thereto, the method comprising: driving the first transistor responsive to an input signal; replicating the first current, thereby generating a third current; driving a translinear loop including the second transistor with the third current; and servoing the translinear loop such that the second and third currents flow through junctions oriented in a first direction around the loop, whereby the product of the first and second currents remains constant. In a preferred embodiment, the method further includes: replicating the first current, thereby generating a fourth current; and discharging current from the second transistor responsive to the fourth current, thereby decreasing the turn-off time of the second transistor.

A further aspect of the present invention is a rail-to-rail output circuit comprising: a first transistor having an emitter coupled to a first power supply rail, a collector coupled to an output terminal, and a base; a second transistor having an emitter coupled to a second power supply rail, a collector coupled to the output terminal, and a base; a third transistor having a base coupled to the base of the first transistor, an emitter coupled to the emitter of the first transistor, and a collector, whereby the collector current of the third transistor replicates the collector current of the first transistor; a first diode coupled between the collector of the third transistor and the base of the second transistor; a fourth transistor having a collector coupled to receive a bias current, a base coupled to the collector of the third transistor, and a collector; and a second diode coupled between the collector of the fourth transistor and the second power supply terminal, whereby the first and second diodes and the second and fourth transistor form a translinear loop. The circuit further includes a fifth transistor having a base coupled to the collector of the fourth transistor, and an emitter coupled to the base of the second transistor, and a resistor coupled between the base and emitter of the second transistor.

An advantage of the present invention is that it takes advantage of the mathematical properties of translinear circuits to synthesize a constant product output characteristic while providing rail-to-rail operation.

Another advantage of the present invention is that it provides a circuit with well-controlled AC and transient performance.

A further advantage of the present invention is that it provides a simple, fast, and elegant circuit for driving a rail-to-rail output stage.

Yet another advantage of the present invention is that it provides accurate and high-frequency stable current limiting.

The foregoing and other objects, features and advantages of the invention will become more readily apparent from the following detailed description of a preferred embodiment of the invention which proceeds with reference to the accompanying drawings.

DETAILED DESCRIPTION

Basic Circuit Topology

Figure 3:
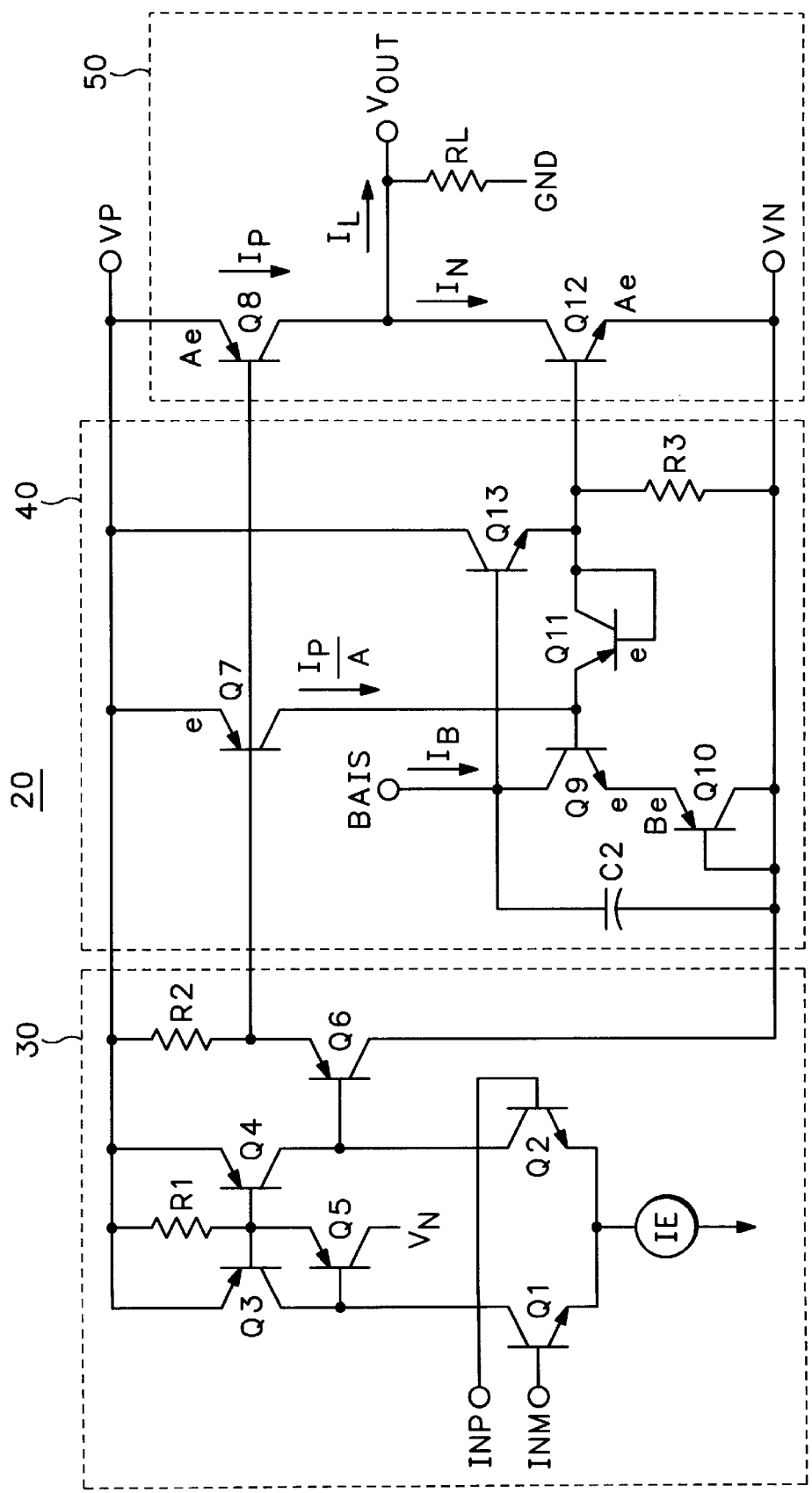
FIG. 3 is a schematic diagram of an embodiment of a rail-to-rail output circuit constructed in accordance with the present invention.

An embodiment of an amplifier constructed in accordance with the present invention is shown generally at 20 in FIG. 3. The amplifier 20 includes a transconductance input stage 30, a translinear drive stage 40, and a rail-to-rail output stage 50.

Figure 2:
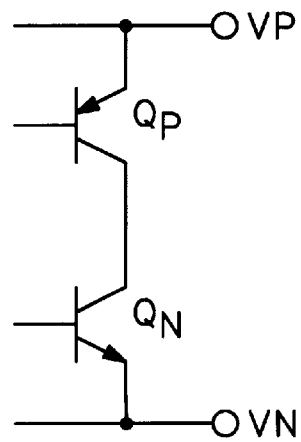
FIG. 2 is a schematic diagram of a generalized prior art configuration of pull-up and pull-down transistors used to obtain rail-to-rail operation.

The output stage 50 includes output transistors Q8 and Q12 configured in the collector-to-collector configuration shown in FIG. 2. Transistor Q8 is a PNP device having its emitter connected to the positive power supply rail VP and its collector connected to the output terminal VOUT. Transistor Q12 is an NPN device having its emitter connected to the negative power supply rail VN and its collector connected to the output terminal VOUT. The terms "VP" and "positive rail" are used interchangeably, and both terms refer to both the positive power supply terminal and the positive power supply signal applied to that terminal. Likewise, "VN" and "negative rail" are used interchangeably, and both terms refer to both the negative power supply terminal and the negative power supply signal applied to that terminal. A load resistor $R_L$ is shown connected between the output terminal VOUT and the power supply ground terminal GND to receive the load current $I_L$. In this embodiment, dual power supplies VP and VN are at positive and negative potentials, respectively, with respect to the ground terminal. However, the circuit will often be configured for operation from a single positive supply, in which case VN will be grounded ($V_N=0$).

The drive stage 40 includes PNP transistor Q7, NPN transistors Q9 and Q13, two diode-connected transistors Q10 and Q11, which, in this embodiment, are implemented as PNP devices, and a 1K resistor R3. Transistor Q9 has its emitter connected to the emitter of Q10, its collector connected to a bias terminal BIAS which receives a bias current $I_B$, and its base connected to the emitter of Q11. The collector and base of Q11 are connected to the base of Q12, and the collector and base of Q10 are connected to VN. Resistor R3 is connected between the base of Q12 and VN. Transistor Q13 is configured as an emitter follower and has its collector connected to VP, its emitter connected to the base of Q12, and its base connected to the bias terminal BIAS. Transistor Q7, which is configured to replicate a fraction of the current $I_P$, has its emitter connected to VP and its collector connected to the base of Q9.

Transistors Q7, Q9, and Q11 have unit emitter areas of "e", transistors Q8 and Q12 have emitter areas of "Ae" (A times e), and transistor Q10 has an emitter area of "Be". The circuit of FIG. 3 is generally intended to be fabricated on an integrated circuit so as to provide good component matching. The factor "A" is preferably relatively large, for example 100.

The input stage 30 is a traditional transconductance amplifier ("gm" stage) and includes NPN transistors Q1 and Q2, PNP transistors Q3, Q4, Q5 and Q6, a 10K resistor R2, and a 10K resistor R1. Transistors Q1 and Q2 are configured as a differential pair with their emitters commonly connected to receive a tail current (bias current) $I_E$, and their bases connected to receive input voltage signals $IN_M$ and $IN_P$, respectively. Transistors Q3, Q4 and Q5 form a current mirror load for loading the differential pair. The emitters of Q3 and Q4 are both connected to VP, their collectors are connected to the collectors of Q1 and Q2, respectively, and their bases are connected together. Transistor Q5 is connected to enhance the gain of the current mirror. The collector of Q5 is connected to VN, and its emitter and base are connected to the base and collector, respectively, of Q3. Transistor Q6 has its emitter connected to the base of Q7, its collector connected to VN, and its base connected to receive an output signal from the input stage 30 at the collector of Q2. Resistor R2 is connected between the emitter of Q6 and VP.

The operation of the circuit of FIG. 3 will now be described. The drive stage 40 is driven by the input stage 30 through transistor Q6 which is connected to Q8 in a Darlington configuration to provide good drive capability in Q8. Transistor Q6 minimizes the loading on the current mirror in the GM cell, thereby enhancing the behavior of the GM cell. Transistor Q8 sources current $I_P$, while Q12 sinks a current $I_N$. The output current $I_L$ is equal to $I_P$ minus $I_N$. The base-emitter voltages of transistors Q7 and Q8 are equal, so the current through Q7 is proportional to the current $I_P$ through Q8. Since the emitter area of Q8 is A times as large as that of Q7, the collector current through Q7 is $I_P/A$. Thus, Q7 essentially monitors $I_P$ and provides the scaled replication current $I_P/A$ to a translinear loop formed by transistors Q9, Q10, Q11, and Q12. Emitter follower transistor Q13 servos the loop so as to maintain the current $I_B$ through the collector of Q9. The current $I_P/A$ from Q7 is absorbed by Q11. Thus, the current density in the base-emitter junction of Q11 is $I_P/A$, the current density in the base-emitter junction of Q12 is $I_N/A$, the current density in the base-emitter junction of Q9 is $I_B$, and the current density in the base-emitter junction of Q10 is $I_B/B$. Applying the translinear principal to the loop results in the following equation:

$$I_P/A \cdot e \cdot I_N/Ae = I_B/e \cdot I_B/Be \qquad \text{(Eq. 3)}$$

Rearranging the terms gives the following result:

$$I_N I_P = A^2/B I_b^2 \qquad \text{(Eq. 4)}$$

Figure 1:
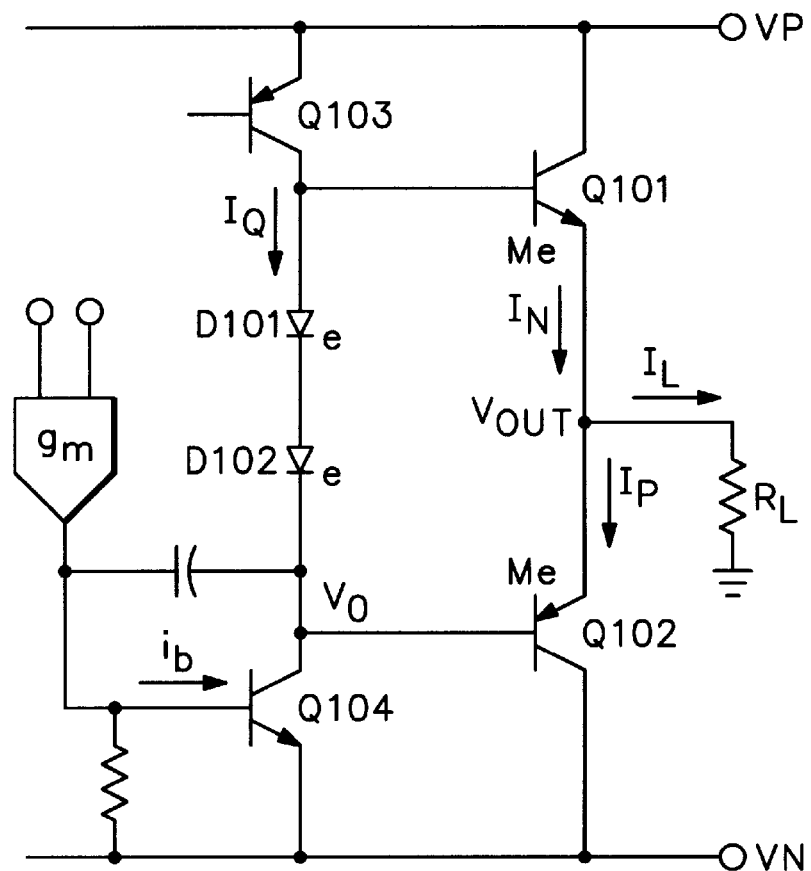
FIG. 1 is schematic diagram of a prior art output stage using emitter followers.

The relationship set forth in Equation 4 is essentially the same as that provided by the circuit of FIG. 1 in Equation 2 except that the emitter areas can be changed to adjust the scaling factor. Thus, the circuit of FIG. 3 synthesizes the same general behavior in terms of the load current relationships as the circuit of FIG. 1, i.e., a constant product relationship, but with the advantage that it allows the output voltage to swing to within about 0.1 volts of the positive and negative power supply rails. A fraction of the current $I_P$ is replicated by Q7 and delivered to a translinear biasing cell in such a manner as to cause the product of the output currents $I_P$ and $I_N$ to be constant.

Resistor R3 performs a dual function. First, it sets up the bias current through emitter follower transistor Q13, and second, it provides a pathway for extracting current from the base of Q12 and thus turns it off. (Although transistors are described herein as turning "on" and turning "off", this does not mean they are being used in a switching manner. Rather, in the context of the analog circuits described herein, turning "on" generally means driving the transistor harder into the conduction region.)

In a typical implementation the constant product relationship is accurate to about ±10 percent with a 100 ohm load, with progressive degradation as the load increases.

Another advantage of the circuit of FIG. 3 is that transistor Q7 and the translinear loop including Q9, Q10, Q11, and Q12 are inherently very fast, so high-frequency distortion is minimized. In all amplifiers, distortion arises due to numerous nonlinear factors. In the circuit of FIG. 3, some of this distortion is caused by a lack of symmetry in sourcing and sinking current to the load. This can be understood by examining the situation in which the input signal condition calls for pulling up the output to create a positive voltage excursion and increase the output current $I_L$. When the base of Q6 is pulled low it simultaneously turns on Q7 and Q8. The signal through the collector of Q7 changes as rapidly as the signal through the collector of Q8. The increased output current from Q7 quickly raises the voltage at the base of Q9, thereby turning on Q9 and Q10 which absorb some of the bias current $I_B$. This, in turn, switches Q13 off and raises the voltage at the base of Q12. Thus, there is a somewhat delayed path to Q12.

However, there are no significant high frequency poles in the translinear loop, which is inherently very fast because its current mode operation is limited by the transition frequency ($f_T$) the transistors rather than the parasitics usually associated with voltage-mode circuits. In general, the transistors in the translinear loop are much faster than the unity gain bandwidth of the overall amplifier and its usual operating frequency. In a monolithic implementation, the $f_T$ of the transistors might be 5–10 GHz, depending on the process, but the overall amplifier might have a unity gain bandwidth of about 100–200 MHz. So the time scales are favorable and the delay is usually insignificant.

An optional capacitor C2 can be connected between the base of Q13 and VN as shown in FIG. 3 to provide on-demand base current to Q13 tinder AC conditions so that the average current in Q9 and Q10 remains unaffected, thereby lowing the high frequency distortion.

Although diode connected transistors Q10 and Q11 can be implemented as NPN devices, it is preferable to use PNP devices, otherwise all of the substrate connected diode capacitance of an NPN device would be present at the emitter of Q9 which must change voltage quickly. Therefore, using PNP devices for Q10 and Q11 allows the voltage at the emitter of Q11 to change quickly.

A further advantage of the present invention is that the translinear loop that controls the pull down current is fundamentally linear. The translinear loop formed by Q9, Q10, Q11 and Q12 is a linear multiplier that forces the product of $I_P$ and $I_N$ to be proportional to the bias current ($I_B$) squared.

High-Frequency Compensation

Figure 4:
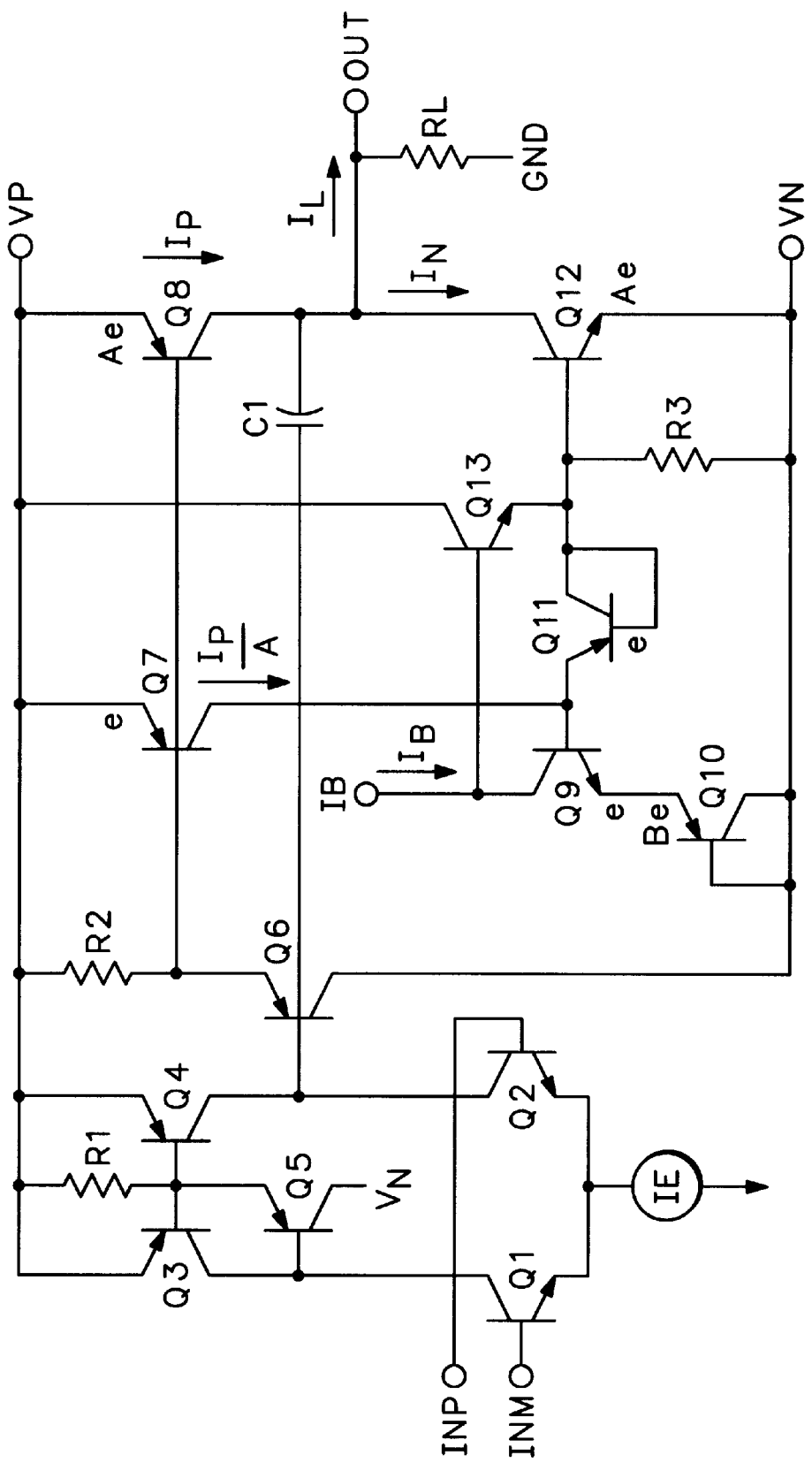
FIG. 4 is a schematic diagram of another embodiment of a rail-to-rail output circuit constructed in accordance with the present invention having high-frequency compensation.

The AC gain of the circuit of FIG. 3 can be controlled by capacitor C1 (generally referred to as a compensation capacitor) as shown in FIG. 4. The circuit of FIG. 4 is similar to that of FIG. 3 except that compensation capacitor C1 is connected between the output terminal VOUT and the base of Q6. The open-loop AC gain of the amplifier is essentially equal to gm/C1, where gm is the transconductance of the input stage Thus, C1 defines the incremental open loop impedance of the amplifier which would otherwise be undefined. Although the use of a compensation capacitors in operational amplifier design is known in the art, FIG. 4 is included to show the connection of C1 required for proper high frequency operation. Capacitor C1 also defines the unity gain frequency of the amplifier and the phase angle (ideally 90 degrees over most of the frequency range).

Compensation capacitors can also be connected between the base of Q9 and the base of Q13 or between the base of Q9 and the output to compensate for the slight delay in the translinear loop formed by Q9, Q10, Q11, and Q12.

Additional Discharge Path

Figure 5:
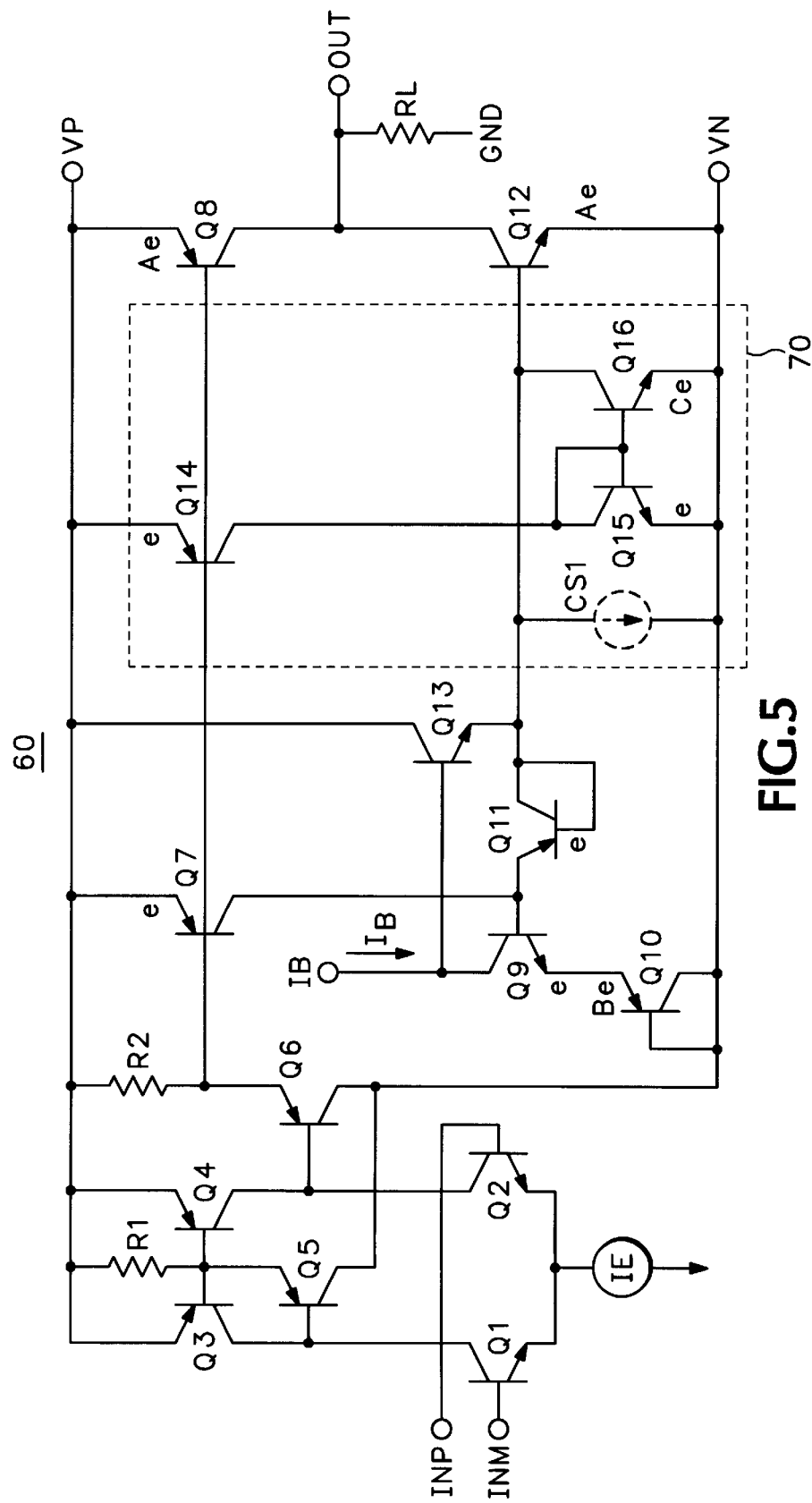
FIG. 5 is a schematic diagram of another embodiment of a rail-to-rail output circuit constructed in accordance with the present invention having an additional discharge path for the pull-down transistor.

An embodiment of the present invention that is suitable for use in more demanding applications is shown generally at 60 in FIG. 5. The circuit of FIG. 5 is in most respects similar to that of FIG. 3 except that resistor R3 is replaced by a turn-off circuit 70 comprised of NPN current mirror transistors Q15 and Q16 and an additional PNP transistor Q14. The remaining components shown in FIG. 5 generally perform the same functions as the components having the same reference designators in FIG. 3.

Referring again to FIG. 5, transistors Q15 and Q16 are configured to form a current mirror. The emitters of Q15 and Q16 are connected to VN, and their bases are connected together. The collector of Q16 is connected to the base of Q12, while the collector of Q15 is diode connected back to its base. The base and emitter of Q14 are connected to the base and emitter, respectively, of Q8, and the collector of Q14 is connected to the collector of Q15.

The operation of the circuit of FIG. 5 is similar to that of FIG. 3, but the addition of the turn off circuit 70 provides a deliberate path for turning Q12 off, thereby increasing the speed of the circuit. In the circuit of FIG. 3, the only pathway for extracting current from the base of Q12 is through resistor R3. Thus, the recombination rate determines rate at which Q12 turns off because Q13 is not involved in turning Q12 off. However, the turn off circuit 70 causes Q12 to turn off much faster. When the input signal condition causes Q8 to turn on, Q14 immediately replicates a fraction of the current $I_P$ through Q8 to provide a scaled current $I_P/A$ to the collector of Q15. This current is then mirrored in Q16 (and multiplied by "C") so as to immediately begin pulling charge from the base of Q12, thereby causing it to turn off faster. The circuit of FIG. 5 is completely translinear because resistor R3 is eliminated.

If the emitter areas of Q7 and Q14 are made equal as shown in FIG. 5, then C must be made greater than one. This is because the currents through Q14 and Q7 increase by fundamentally the same amount as Q8 turns on. If C were equal to one, then all of the current through Q7 (which is tracked in Q14) would also flow through Q16, and there would be no bias current available for Q13. By making C greater than one, additional bias current is provided for Q13.

Alternatively, C can be made equal to one if an optional current source CS1 is connected between the emitter of Q13 and VN as shown in dotted lines in FIG. 5. Current source CS1 is preferably designed to provides the unique bias current required in Q13. CS1 can be implemented as a transistor (which could share a bias signal with a transistor used to implement the tail current source IE in the gm stage), or it can be implemented as a resistor.

Accurate Current Limiting

Figure 6:
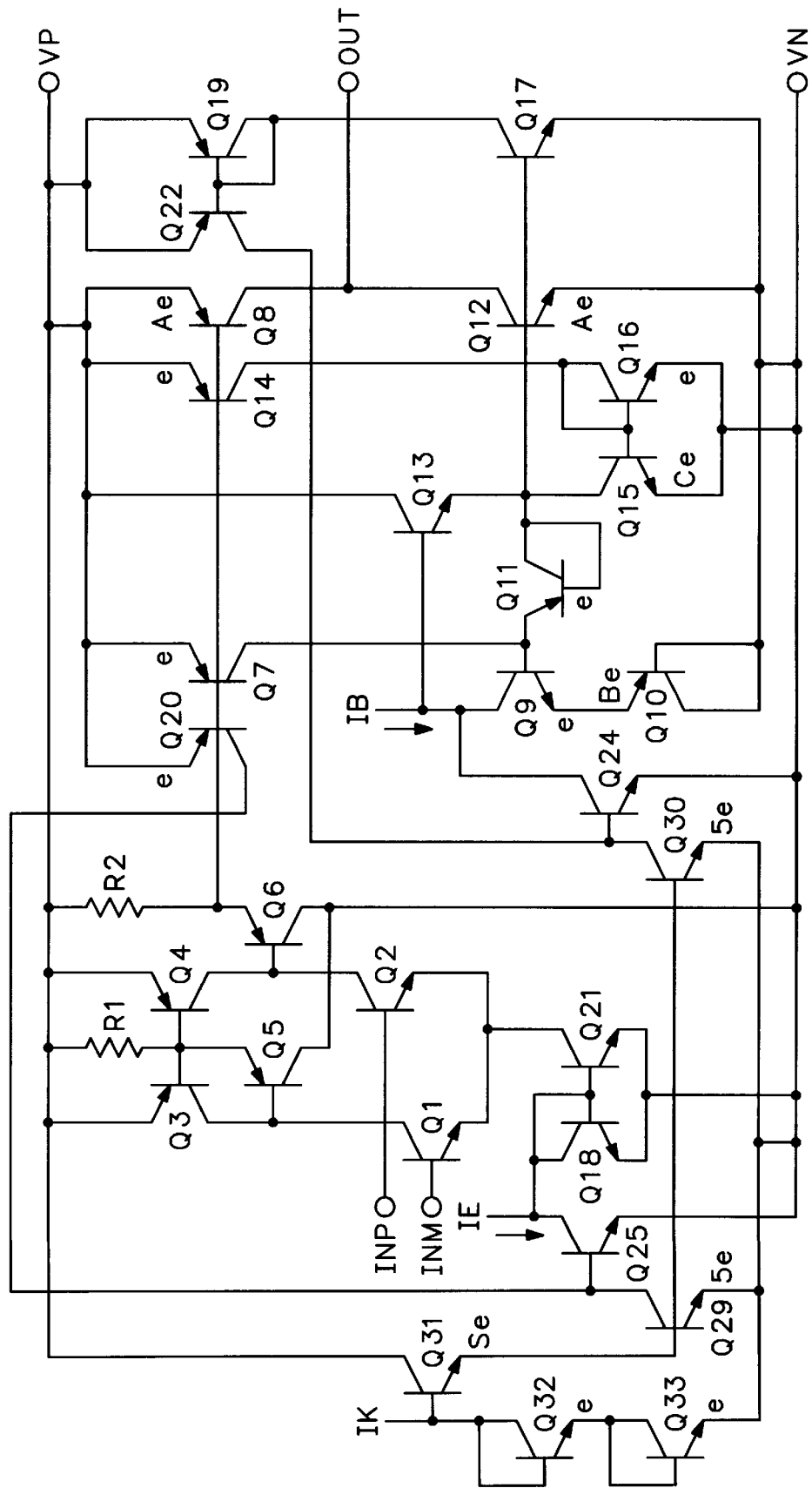
FIG. 6 is a schematic diagram of another embodiment of a rail-to-rail output circuit constructed in accordance with the present invention having accurate current limiting.

An embodiment of the present invention that provides accurate current limiting is shown generally at 80 in FIG. 6. The circuit of FIG. 6 is in many respects similar to that of FIG. 5, and components that generally perform the same functions are shown with the same reference designators as in FIG. 5.

The circuit of FIG. 6 also includes a current limit circuit that can generally be divided into two sections. The first section includes NPN transistors Q17, Q24 and Q30, and PNP transistors Q19 and Q22, while the second section includes NPN transistors Q18, Q21, Q25 and Q29, and PNP transistor Q20.

Transistor Q17 has a unit emitter area "e" and is arranged with its base-emitter junction in parallel with the base-emitter junction of Q12. Transistor Q30 has its emitter connected to the negative power supply rail VN and its base coupled to receive a bias voltage signal so that Q30 generates an accurate reference current through its collector. Transistor Q24 has its emitter connected to VN, its base connected to the collector of Q24, and its collector connected to the collector of Q9. The emitters of Q19 and Q22 are both connected to VP, and the bases of Q19 and Q22 are both connected to the collector of Q19 which is also connected to the collector of Q17. The collector of Q22 is connected to the collector of Q30.

The second section of the current limit circuit operates on the transconductance input stage 30 which is described above with respect to FIG. 3. In the circuit of FIG. 6, the tail current $I_E$ is not provided to the differential pair Q1 and Q2 directly from the tail current source, but instead is provided to Q1 and Q2 through a current mirror formed by Q18 and Q21. The emitters of Q18 and Q21 are both connected to VN, and the bases of Q18 and Q21 are both connected to the collector of Q18 which is also connected to the tail current source to receive the tail current $I_E$. The collector of Q21 is connected to the emitters of Q1 and Q2.

Transistor Q20 has a unit emitter area "e" and is arranged with its base-emitter junction in parallel with the base-emitter junction of Q8. Transistor Q29 has its emitter connected to the negative power supply rail VN and its base coupled to receive a bias voltage signal so that Q29 generates an accurate reference current through its collector. Transistor Q25 has its emitter connected to VN, its base connected to the collector of Q29, and its collector connected to the collector of Q9. The emitters of Q19 and Q22 are both connected to VP, and the bases of Q19 and Q22 are both connected to the collector of Q19 which is also connected to the collector of Q17. The collector of Q22 is connected to the collector of Q30.

The first section of the current limit circuit operates to limit the current through Q12 as follows. Transistor Q17 replicates the current $I_N$ through Q12, thereby generating a replicated current $I_N/A$ in its collector. Transistors Q22 and Q19 form a current mirror that are arranged to reflect the current in the collector of Q17 into the node formed at the collector of Q30. The replicated current $I_N/A$ is summed with the accurate reference current flowing into the collector of Q30. Transistor Q24 diverts a portion of the bias current $I_B$ in response to the difference between the reference current and the replicated current. When the current $I_N$ reaches an excessive level, transistor Q24 turns on and diverts enough of the bias current to reduce the current through Q12.

The second section of the current limit circuit operates in a manner similar to the first section. Transistor Q20 replicates the current through Q8, the replicated current is summed with an accurate reference current generated by Q29, and transistor Q25 diverts current from the tail current source that generates tail current signal $I_E$ when the current through Q8 becomes excessive.

An advantage of the current limit circuit described in FIG. 6 is that it provides very accurate control of the maximum current because the magnitude and behavior of the reference current through transistors Q29 and Q30 can be controlled very accurately regardless of changes in temperature. Another advantage of the current limit circuit of FIG. 6 is that the simplicity of the circuit provides excellent transient response and very stable operation. Thus, the circuit does not oscillate when the current limiting function operates.

Having described and illustrated the principles of the invention in a preferred embodiment thereof, it should be apparent that the invention can be modified in arrangement and detail without departing from such principles. We claim all modifications and variations coming within the spirit and scope of the following claims.

I claim:

1. A rail-to-rail output circuit comprising:
   a first transistor having a first terminal coupled to a first power supply rail, and a second terminal coupled to an output terminal to provide a first current thereto;
   a second transistor having a first terminal coupled to a second power supply rail, and a second terminal coupled to the output terminal for providing a second current thereto;
   a third transistor coupled to the first transistor to replicate the first current, thereby generating a third current; and
   a bias circuit coupled to the third transistor to receive the third current and coupled to the second transistor to form a translinear loop with the second transistor.

2. A circuit according to claim 1 wherein the bias circuit further includes a transistor coupled to the translinear loop to servo the loop.

3. A circuit according to claim 1 wherein the bias circuit maintains the product of the first and second currents at a constant value.

4. A circuit according to claim 3 wherein the bias circuit is coupled to receive a bias signal, and the constant value varies responsive to the bias signal.

5. A rail-to-rail output circuit comprising:
   a first transistor having a first terminal coupled to a first power supply rail, and a second terminal coupled to an output terminal to provide a first current thereto;
   a second transistor having a first terminal coupled to a second power supply rail, and a second terminal coupled to the output terminal for providing a second current thereto;
   a third transistor coupled to the first transistor to replicate the first current, thereby generating a third current; and
   a bias circuit coupled to the third transistor to receive the third current and coupled to the second transistor to form a translinear loop with the second transistor;
   wherein the third transistor includes a first terminal coupled to the first power supply rail, a second terminal coupled to a third terminal of the first transistor, and a third terminal for providing the third current, and wherein the biasing circuit includes:
      a first diode coupled between the third terminal of the third transistor and a third terminal of the second transistor;
      a fourth transistor having a first terminal coupled to receive a bias signal, and a second terminal coupled to the third terminal of the third transistor; and
      a diode coupled between a third terminal of the fourth transistor and the second power supply rail.

6. A circuit according to claim 5 wherein the bias circuit further includes a resistor coupled between the first and third terminals of the second transistor.

7. A circuit according to claim 6 wherein the bias circuit further includes a fifth transistor having a first terminal coupled to the first terminal of the fourth transistor and a second terminal coupled to the third terminal of the second transistor.

8. A circuit according to claim 1 further including a turn-off circuit coupled to the second transistor.

9. A rail-to-rail output circuit comprising:
   a first transistor having a first terminal coupled to a first power supply rail, and a second terminal coupled to an output terminal to provide a first current thereto;
   a second transistor having a first terminal coupled to a second power supply rail, and a second terminal coupled to the output terminal for providing a second current thereto;
   a third transistor coupled to the first transistor to replicate the first current, thereby generating a third current;
   a bias circuit coupled to the third transistor to receive the third current and coupled to the second transistor to form a translinear loop with the second transistor; and
   a turn-off circuit coupled to the second transistor;
   wherein the turn-off circuit includes:
      a fourth transistor coupled to the first transistor to replicate the first current, thereby generating a fourth current; and

11 a current mirror coupled between the fourth transistor and a third terminal of the second transistor.

10. A circuit according to claim 1 further including:
a fourth transistor coupled to the third transistor to form a cascade configuration with the third transistor, wherein the fourth transistor drives the first and third transistors responsive to an input signal; and
a capacitor coupled between the output terminal and the fourth transistor.

11. A circuit according to claim 5 further including a current limit circuit comprising:
a fifth transistor coupled to the second transistor to replicate the second current, thereby generating a fourth current;
a current source for providing a fifth current;
a current mirror coupled between the fifth transistor and the current source to provide the fourth current to the current source; and
a sixth transistor coupled to the current source and the first terminal of the fourth transistor for diverting a portion of the bias signal responsive to the difference between the fifth current and the fourth current;
whereby the current limit circuit accurately limits the second current.

12. A circuit according to claim 5 further including:
an input stage coupled to the first transistor for driving the first transistor responsive to an input signal and a tail current; and
a current limit circuit comprising:
a current mirror coupled between a tail current source and the input stage to provide the tail current to the input stage;
a fifth transistor coupled to the first transistor to replicate the first current, thereby generating a fourth current;
a current source coupled to the fifth transistor to provide a fifth current thereto;
a sixth transistor coupled to the current source and the current mirror diverting a portion of the tail current responsive to the difference between the fifth current and the fourth current;
whereby the current limit circuit accurately limits the first current.

13. A method for driving a rail-to-rail output circuit including a first transistor having a first terminal coupled to a first power supply rail, and a second terminal coupled to an output terminal to provide a first current thereto, and a second transistor having a first terminal coupled to a second power supply rail, and a second terminal coupled to the output terminal for providing a second current thereto, the method comprising:
driving the first transistor responsive to an input signal;
replicating the first current, thereby generating a third current; and
driving a translinear loop including the second transistor with the third current.

14. A method according to claim 13 further including:
replicating the first current, thereby generating a fourth current; and
discharging current from the second transistor responsive to the fourth current, thereby decreasing the turn-off time of the second transistor.

15. A method according to claim 13 further including:
driving the first transistor with a fourth transistor responsive to an input signal; and

12 coupling the output terminal to the fourth transistor, thereby providing high-frequency compensation.

16. A method according to claim 13 further including servoing the translinear loop such that the second and third currents flow through junctions oriented in a first direction around the loop, whereby the product of the first and second currents remains constant.

17. A method for driving a rail-to-rail output circuit including a first transistor having a first terminal coupled to a first power supply rail, and a second terminal coupled to an output terminal to provide a first current thereto, and a second transistor having a first terminal coupled to a second power supply rail, and a second terminal coupled to the output terminal for providing a second current thereto, the method comprising:
driving the first transistor responsive to an input signal;
replicating the first current, thereby generating a third current;
driving a translinear loop including the second transistor with the third current;
servoing the translinear loop such that the second and third currents flow through junctions oriented in a first direction around the loop, whereby the product of the first and second currents remains constant;
driving the translinear loop with a bias current such that the bias current flows through junctions oriented in a second direction around the loop, whereby the product of the first and second currents is proportional to the bias current;
replicating the second current, thereby generating a fourth current; and
controlling the bias current responsive to the fourth current, thereby limiting the second current.

18. A method for driving a rail-to-rail output circuit including a first transistor having a first terminal coupled to a first power supply rail, and a second terminal coupled to an output terminal to provide a first current thereto, and a second transistor having a first terminal coupled to a second power supply rail, and a second terminal coupled to the output terminal for providing a second current thereto, the method comprising:
driving the first transistor responsive to an input signal;
replicating the first current, thereby generating a third current;
driving a translinear loop including the second transistor with the third current;
servoing the translinear loop such that the second and third currents flow through junctions oriented in a first direction around the loop, whereby the product of the first and second currents remains constant;
driving the translinear loop with a bias current such that the bias current flows through junctions oriented in a second direction around the loop, whereby the product of the first and second currents is proportional to the bias current; and
controlling the bias current responsive to the power supply voltage, thereby limiting the power dissipation in the output circuit.

19. A rail-to-rail output circuit comprising:
a first transistor having an emitter coupled to a first power supply rail, a collector coupled to an output terminal, and a base;
a second transistor having an emitter coupled to a second power supply rail, a collector coupled to the output terminal, and a base;

a third transistor having a base coupled to the base of the first transistor, an emitter coupled to the emitter of the first transistor, and a collector, whereby the collector current of the third transistor replicates the collector current of the first transistor;

a first diode coupled between the collector of the third transistor and the base of the second transistor;

a fourth transistor having a collector coupled to receive a bias current, a base coupled to the collector of the third transistor, and a collector; and a second diode coupled between the collector of the fourth transistor and the second power supply terminal, whereby the first and second diodes and the second and fourth transistor form a translinear loop.

20. A circuit according to claim 19 further including a fifth transistor having a base coupled to the collector of the fourth transistor, and an emitter coupled to the base of the second transistor.

21. A circuit according to claim 20 further including a resistor coupled between the base and emitter of the second transistor.

22. A circuit according to claim 20 further including:

a sixth transistor having an emitter coupled to the emitter of the first transistor, a base coupled to the base of the first transistor, and a collector; and a current mirror coupled between the collector of the sixth transistor and the base of the second transistor.

23. A circuit according to claim 22 wherein the current mirror includes:

a seventh transistor having an emitter coupled to the second power supply rail, a collector coupled to the collector of the sixth transistor, and a base coupled back to its collector; and an eighth transistor having an emitter coupled to the second power supply rail, a collector coupled to the base of the second transistor, and a base coupled to the base of the seventh transistor.

24. A circuit according to claim 19 further including:

a fifth transistor having an emitter coupled to the base of the third transistor and a base coupled to receive an input signal; and a capacitor coupled between the output terminal and the base of the fifth transistor.

25. A circuit according to claim 19 further including:

a fifth transistor having a base coupled to the base of the second transistor, an emitter coupled to the emitter of the second transistor, and a collector, whereby the collector current of the fifth transistor replicates the collector current of the second transistor;

a sixth transistor having an emitter coupled to the second power supply rail, a base coupled to the second power supply rail through a current source, and a collector coupled to the collector of the fourth transistor; and a current mirror coupled between the collector of the fifth transistor and the base of the sixth transistor.

26. A circuit according to claim 19 further including:

an input stage coupled to the first transistor for driving the first transistor responsive to an input signal;

a first current source for providing a tail current to the input stage;

a current mirror coupled between the first current source and the input stage;

a fifth transistor having a base coupled to the base of the first transistor, an emitter coupled to the emitter of the first transistor, and a collector, whereby the collector current of the fifth transistor replicates the collector current of the first transistor;

a sixth transistor having an emitter coupled to the second power supply rail, a base coupled to the second power supply rail through a second current source, and a collector coupled to the first current source.

27. A rail-to-rail output circuit comprising:

a first transistor coupled between a first power supply rail and an output terminal for providing a first current thereto;

a second transistor coupled between a second power supply rail and the output terminal for providing a second current thereto;

a third transistor coupled to the first transistor for generating a third current that replicates the first current; and a bias circuit coupled between the third and second transistors so as to form a translinear loop with the second transistor, wherein the translinear loop is a multiplier for maintaining the product of the first and second currents at a constant value.

28. A method according to claim 16 further including driving the translinear loop with a bias current such that the bias current flows through junctions oriented in a second direction around the loop, whereby the product of the first and second currents is proportional to the bias current.

* * * * *

UNITED STATES PATENT AND TRADEMARK OFFICE
CERTIFICATE OF CORRECTION

PATENT NO.      : 6,104,244
APPLICATION NO. : 09/146052
DATED           : August 15, 2000
INVENTOR(S)     : Barrie Gilbert It is certified that error appears in the above-identified patent and that said Letters Patent is hereby corrected as shown below:

On the Title Pg, Item (57)

Abstract, line 15, "transistor is be connected" should read --transistor is connected--.

Column 1, line 30, "that there arc" should read --that there are--.

Column 2, line 13, "Circuit that utilize" should read --Circuits that utilize--.

Column 2, line 19, "they arc generally" should read --they are generally--.

Column 3, line 1, "sharing the of the pull-up" should read --sharing the pull-up--.

Column 3, line 10, "limiting through by generating" should read --limiting by generating--.

Column 3, line 24, "a an optional constant" should read --an optional constant--.

Column 5, line 38, ""c", transistors Q8" should read --"e", transistors Q8--.

Column 6, line 25, " $I_N I_P = \dfrac{A^2}{B} I_B^2$ (Eq. 4) " should read -- $I_N I_P = \dfrac{A^2}{b} I_B^2$ (Eq. 4) --.

Column 7, line 15, "Q13 tinder" should read --Q13 under--.

Column 7, line 17, "thereby lowing the" should read --thereby lowering the--.

Column 7, line 26, "the pull down current" should read --the pull-down current--.

Column 7, line 40, "input stage Thus," should read --input stage. Thus,--

Column 8, line 1, "Q15 is diode" should read --Q15 is a diode--.

Signed and Sealed this

Twenty-first Day of September, 2010

David J. Kappos
*Director of the United States Patent and Trademark Office*

Column 8, line 10, "recombination rate determines rate," should read --recombination rate determines the rate--.

Column 8, line 32, "designed to provides" should read --designed to provide--.

Column 12, line 3, "16. A method according to claim 13 further including servoing the translinear loop such that the second and third currents flow through junctions oriented in a first direction around the loop, whereby the product of the first and second currents remains constant." should read --16. A method according to claim 28 further including driving the translinear loop with a bias current such that the bias current flows through junctions oriented in a second direction around the loop, whereby the product of the first and second currents is proportional to the bias current.--.

Column 14, line 42, "28. A method according to claim 16 further including driving the translinear loop with a bias current such that the bias current flows through junctions oriented in a second direction around the loop, whereby the product of the first and second currents is proportional to the bias current." should read --28. A method according to claim 13 further including servoing the translinear loop such that the second and third currents flow through junctions oriented in a first direction around the loop, whereby the product of the first and second currents remains constant.--.